(12) United States Patent
Ikegami et al.

(10) Patent No.: US 6,566,261 B2  
(45) Date of Patent: May 20, 2003

(54) SEMICONDUCTOR DEVICE AND METHOD OF MANUFACTURING THE SAME

(75) Inventors: Hiroshi Ikegami, Hiratsuka (JP); Rempei Nakata, Kamakura (JP); Takashi Yoda, Machida (JP); Nobuo Hayasaka, Yokosuka (JP); Yoshimi Hisatsune, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/946,601

(22) Filed: Sep. 6, 2001

(65) Prior Publication Data  
US 2002/0050647 A1 May 2, 2002

(30) Foreign Application Priority Data  
Sep. 7, 2000 (JP) ........................... 2000-272211  
Jul. 18, 2001 (JP) ........................... 2001-218528

(51) Int. Cl.$^7$ ............................................. H01L 21/44  
(52) U.S. Cl. .................. 438/687; 438/586; 438/626; 438/482; 438/683; 438/745; 438/959  
(58) Field of Search .................. 438/687, 586, 438/626, 482, 483, 627, 629, 637, 643, 648, 656, 667, 680, 683, 745, 959

(56) References Cited

U.S. PATENT DOCUMENTS 5,945,155 A * 8/1999 Grill et al. .................. 427/122  
6,126,806 A * 10/2000 Uzoh ........................... 205/182

FOREIGN PATENT DOCUMENTS

JP 4-350937 12/1992  
JP 8-130248 5/1996

* cited by examiner

Primary Examiner—Matthew Smith  
Assistant Examiner—Igwe U. Anya  
(74) Attorney, Agent, or Firm—Finnegan, Henderson, Farabow, Garrett & Dunner, L.L.P.

(57) ABSTRACT

There is provided a semiconductor device including a semiconductor substrate and a conductive layer above the semiconductor substrate, wherein the conductive layer contains copper, a surface region of the conductive layer contains at least one of C—H bonds and C—C bonds, and a total amount of C atoms forming the C—H bonds and C atoms forming the C—C bonds in the surface region is 30 atomic % or more of a whole amount of elements in the surface region.

17 Claims, 10 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Applications No. 2000-272211, filed Sep. 7, 2000; and No. 2001-218528, filed Jul. 18, 2001, the entire contents of both of which are incorporated herein by

BACKGROUND OF THE INVENTION

1. Field of the Invention

The present invention relates to a semiconductor device and a method of manufacturing the same, particularly, to a semiconductor device including a copper wiring and a method of manufacturing the same.

2. Description of the Related Art

In the conventional semiconductor device, aluminum is widely used as the material of the wiring. In recent years, copper having a lower resistivity and cheaper has come to be used as a wiring material in place of aluminum. However, if a Cu wiring is subjected to a heat treatment in an atmosphere containing oxygen, oxidation of the Cu wiring surface proceeds, with the result that the resistance of the wiring is markedly increased.

FIGS. 1A to 1C are cross sectional views schematically showing a conventional process of forming a multilayer interconnection structure. As shown in FIG. 1A, a first interlayer insulation film 13 is formed on a semiconductor substrate 2, and a first Cu wiring 14 is buried in the insulation film 13. Incidentally, the Cu wiring 14 is the one which contains mainly Cu and has a layer or layers containing a material such as Ta, TaN, Ti or TiN on the sidewalls and bottom surface thereof.

In the conventional process, an interlayer insulation film 23 is formed as a continuous film on the insulation film 13 and the wiring layer 14, followed by forming a resist pattern 5 on the insulation film 23, as shown in FIG. 1A. It is noted that interlayer insulation film has a single-layer or a multi-layer structure and includes a film such as a silicon nitride film (herein after referred to as "SiN film"), silicon oxide film, organosilicon film or organic insulation film. In the next step, a groove for a second Cu wiring is formed in the insulation film 23 by a reactive ion etching (hereinafter referred to as "RIE") by using the resist pattern 5 as a mask, as shown in FIG. 1B. Incidentally, the Cu wiring 14 is exposed to the outside for the via contact in a part of the bottom surface of the groove formed in the insulation film 23. Then, the resist pattern 5 is removed by the ashing in an atmosphere containing oxygen. In this step, the uncovered portion of the Cu wiring 14, which is exposed to oxygen at a high temperature, is oxidized so as to form an oxide film 14a made of, for example, $Cu_2O$, as shown in FIG. 1C. By the oxidation of Cu into $Cu_2O$, the $Cu_2O$ layer is expanded to a volume 1.65 times as much as the original Cu layer. As a result, where the oxide film 14a is formed as shown in FIG. 1C, cracks tend to be generated around the oxide film 14a.

A similar problem also takes place in the case where copper is used as a material of an electrode such as a bonding pad.

FIGS. 2A and 2B are cross sectional views schematically showing a conventional bonding process. In FIG. 2A, an interlayer insulation film 13 is formed on the semiconductor substrate 2, and a bonding pad 4 made of copper is buried in the insulation film 13. Further, an SiN film 6 and an insulation film 23 are successively formed on the insulation film 13.

The bonding of an Au wire to the pad 4 shown in FIG. 2A is carried out generally in the air atmosphere under the state that the substrate 2 is heated to a high temperature. Therefore, the surface of the pad 4 is exposed to a high temperature oxygen so as to be oxidized, resulting in formation of an oxide film 4a made of, for example, $Cu_2O$. It follows that cracks are generated around the pad 4 so as to cause a peeling problem in some cases.

The process shown in FIGS. 3A to 3F and the process shown in FIGS. 4A to 4C are known to the art as the process for preventing the occurrence of the cracks described above with reference to FIGS. 1A to 1C, 2A and 2B.

FIGS. 3A to 3F are cross sectional views schematically showing another conventional process of forming a multi-layer interconnection structure. In the conventional process, a Cu wiring 14 is formed first as shown in FIG. 3A, followed by forming an SiN film 16, an interlayer insulation film 23 and a resist pattern 5, as shown in FIG. 3B. Then, a groove is formed in the insulation film 23 by RIE with the resist pattern 5 used as a mask, as shown in FIG. 3C. In this etching step, the SiN film 16 plays the role of an etching stopper. Then, the resist pattern 5 is removed by the ashing carried out in an atmosphere containing oxygen 11, as shown in FIG. 3D. In the next step, that portion of the SiN film 16 which is positioned within the groove is removed by etching as shown in FIG. 3E, followed by filling the groove with copper to form a Cu wiring 24, as shown in FIG. 3F. According to this process, the Cu wiring 14 is covered with the SiN film 16 and, thus, is not oxidized in the ashing step. It follows that it is possible to prevent the crack occurrence.

FIGS. 4A to 4C are cross sectional views schematically showing another conventional bonding process. In this process, the interlayer insulation film 13, the bonding pad 4 made of copper, the SiN film 6, and the insulation film 23 are formed successively on the semiconductor substrate 2, as shown in FIG. 4A. In the next step, an aluminum electrode 7 is formed to cover the side walls and the bottom surface of the groove formed in the SiN film 6 and the insulation film 23, as shown in FIG. 4B. Then, an Au wire 8 is bonded to the electrode 7, as shown in FIG. 4C. It should be noted that, in this process, the bonding pad 4 within the groove is covered with the aluminum electrode 7, with the result that the bonding pad 4 is not oxidized in the bonding step of the Au wire 8.

As described above, in the process shown in FIGS. 1A to 1C and in the process shown in FIGS. 2A and 2B, the surfaces of the Cu wiring 14 and the Cu pad are oxidized. In contrast to the processes, it is possible to prevent the surfaces of the Cu wiring 14 and the Cu pad 4 from being oxidized in the processes described with reference to FIGS. 3A to 3F and to FIGS. 4A to 4C. On the other hand, however, required are additional step of forming the SiN film 16, the etching step and the step of forming the Al electrode 7.

It is possible for another problem to occur in accordance with oxidation of the Cu wiring and the Cu pad. For example, if a potential difference is generated between the Cu wiring and the interlayer insulation film, copper oxide tends to be ionized so as to be diffused into the insulation film. Such a diffusion brings about increases in the wiring resistance and in the wiring capacitance. In general, an SiN film or an SiCH film is formed as a diffusion barrier film by a chemical vapor deposition (hereinafter referred to as "CVD") on the surface of the interlayer insulation film in which is buried the Cu wiring. What should be noted is that it is difficult for the bonding strength between the SiN film or the SiCH film and the copper oxide film to be maintained in a satisfactory state.

It is possible to suppress the problem accompanying the oxidation of the Cu wiring by applying a surface treatment to the Cu wire by utilizing a plasma using, for example, an $NH_3$ gas or an $H_2$ gas as the raw material. However, such a plasma processing gives rise to the problem described below.

In the conventional semiconductor device having a multilayer interconnection structure, a silicon oxide film having a relative dielectric constant κ of about 4.1 was used in general as an interlayer insulation film. In recent years, vigorous studies are being made in an attempt to put into practical use a multilayer interconnection structure in which an organosilicon film or an organic film having a relative dielectric constant κ of about 4.1 is used as the interlayer insulation film and copper is used as a material of the wiring. According to the particular construction, it is possible to suppress both the wiring resistance and the wiring capacitance.

However, where the plasma processing noted above is applied to the organosilicon film or the organic film, the organic components are migrated out of the surface region of the organosilicon film or the organic film, with the result that the surface region forms a brittle denatured layer. The denatured layer lowers the bonding strength between the interlayer insulation film and the diffusion barrier film to cause, in the subsequent heat treating step, a peeling of the diffusion barrier film from the interlayer insulation film. Also, the denatured layer tends to adsorb water easily. Since the insulation film absorbing water tends to exhibit a high dielectric constant, formation of the denatured layer impairs the effect of suppressing the wiring capacitance. In addition, since the insulation film absorbing water generates a gas in the heat treating step, the peeling of the diffusion barrier film is promoted.

What should also be noted is that, where the diffusion barrier film is formed by a coating method, it is difficult to carry out the plasma processing and the formation of the diffusion barrier film successively under vacuum. It follows that, even if the surface of the Cu wiring is reduced by the plasma processing, the surface of the Cu wiring is oxidized again. If an oxide film is formed on the surface of the Cu wiring, the wiring resistance is increased by the increase in the surface resistance. In addition, the wiring capacitance is also increased.

BRIEF SUMMARY OF THE INVENTION

According to a first aspect of the present invention, there is provided a semiconductor device comprising a semiconductor substrate and a conductive layer above the semiconductor substrate, wherein the conductive layer contains copper, a surface region of the conductive layer contains at least one of C—H bonds and C—C bonds, and a total amount of C atoms forming the C—H bonds and C atoms forming the C—C bonds in the surface region is 30 atomic % or more of a whole amount of elements in the surface region.

According to a second aspect of the present invention, there is provided a semiconductor device comprising a semiconductor substrate and a conductive layer above the semiconductor substrate, wherein the conductive layer contains copper, and a surface of the conductive layer is provided with particles each of which contains carbon.

According to a third aspect of the present invention, there is provided a method of manufacturing a semiconductor device, comprising, forming a first conductive layer containing copper above a semiconductor substrate, supplying a surface of the first conductive layer with a substance containing carbon, and forming a second conductive layer on the surface of the first conductive layer on which carbon originating from the substance remains.

According to a fourth aspect of the present invention, there is provided a method of manufacturing a semiconductor device, comprising, forming a conductive layer on a first insulation layer containing carbon, the first insulation layer being supported by a semiconductor substrate, treating exposed surfaces of the conductive layer and the first insulation layer with a plasma containing carbon, and forming a second insulation layer on the conductive layer and the first insulation layer after the treatment of the surfaces with the plasma.

DETAILED DESCRIPTION OF THE INVENTION

Figure 1A:
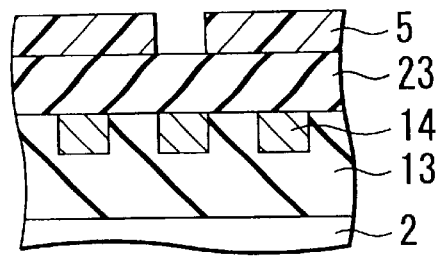
FIGS. 1A to 1C are cross sectional views schematically showing a conventional process of forming a multilayer interconnection structure.
Figure 1B:
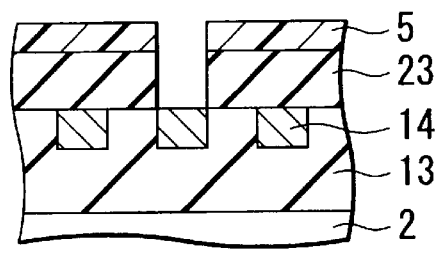
Figure 1C:
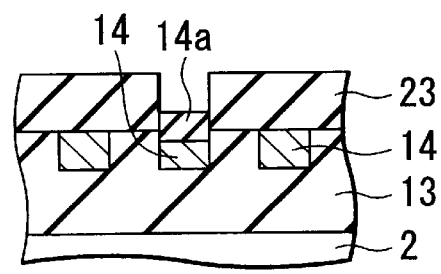
Figure 2A:
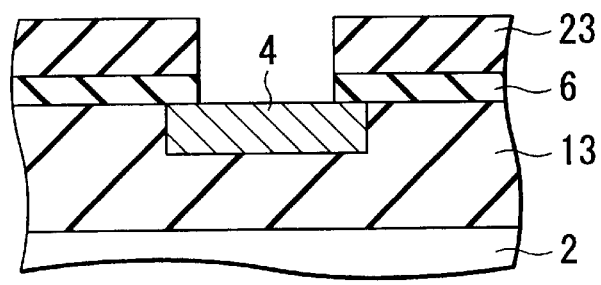
FIGS. 2A and 2B are cross sectional views schematically showing a conventional bonding process.
Figure 2B:
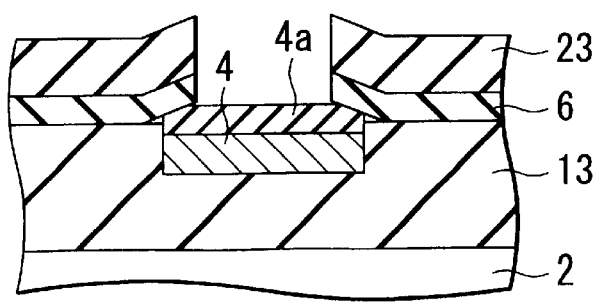
Figure 3A:
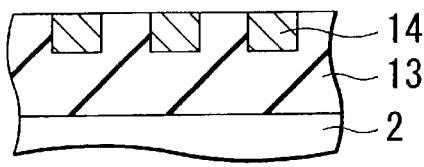
FIGS. 3A to 3F are cross sectional views schematically showing another conventional process of forming a multilayer interconnection structure.
Figure 3B:
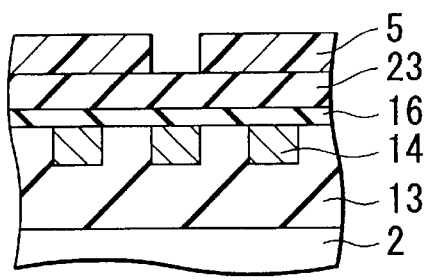
Figure 3C:
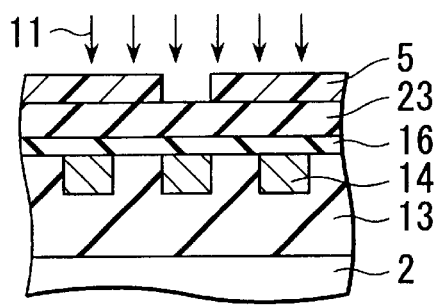
Figure 3D:
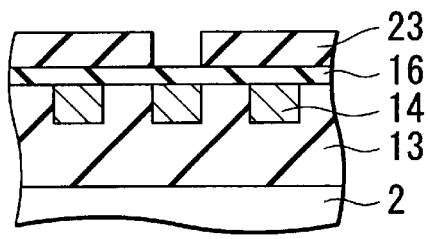
Figure 3E:
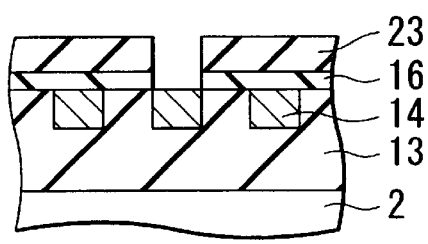
Figure 3F:
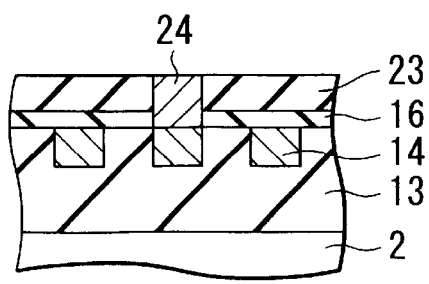
Figure 4A:
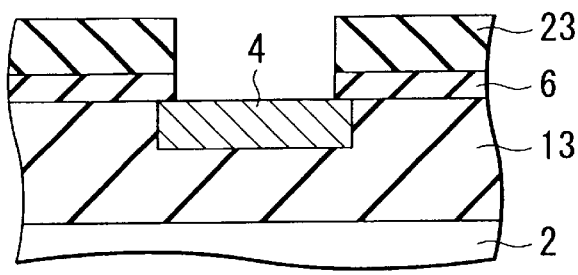
FIGS. 4A to 4C are cross sectional views schematically another conventional bonding process.
Figure 4B:
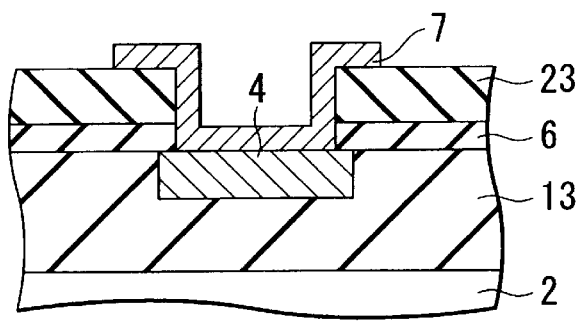
Figure 4C:
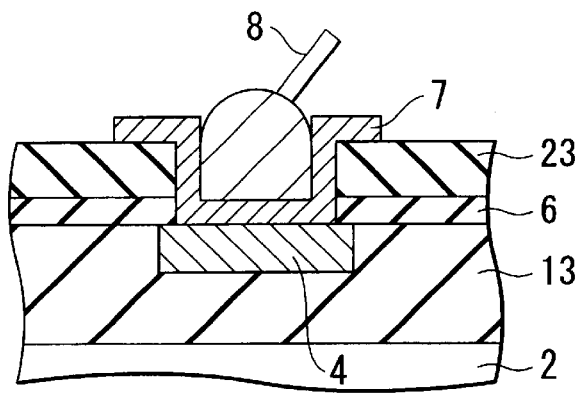

Each embodiment of the present invention will now be described in detail with reference to the accompanying drawings. Throughout the drawings, the same or similar constituent elements are denoted by the same reference numerals so as to avoid an overlapping description.

Figure 5A:
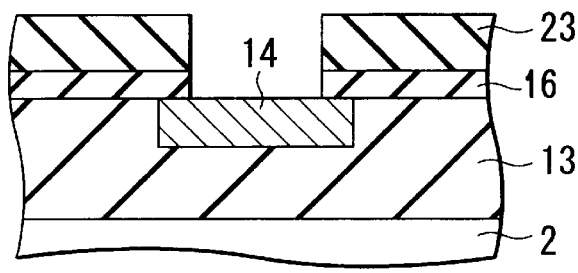
FIGS. 5A and 5B are cross sectional views schematically showing a treatment that can be utilized in a manufacturing process of a semiconductor device according to a first embodiment of the present invention.
Figure 5B:
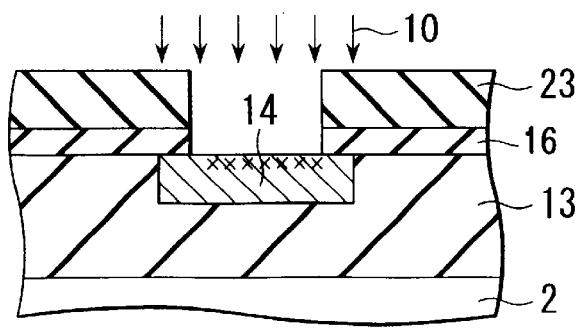

FIGS. 5A and 5B are cross sectional views schematically showing a treatment that can be utilized in a manufacturing process of a semiconductor device according to a first embodiment of the present invention. As shown in FIGS. 5A and 5B, a first insulation layer 13 is formed on a semiconductor substrate 2 having a transistor, etc. formed on the surface. A groove is formed in the insulation film 13, and a wiring 14 made of copper is buried in the groove. Further, an SiN film 16 and a second interlayer insulation film 23 each having an opening formed therein are formed on the insulation film 13 and the wiring 14.

In the structure shown in FIG. 5A, the wiring 14 is partially exposed to the outside within the opening formed in the SiN film 16 and the second interlayer insulation film 23. Therefore, if a heat treatment is applied to the structure shown in FIG. 5A in an atmosphere containing oxygen, the exposed surface of the wiring 14 is oxidized. In the present embodiment, however, the exposed portion of the wiring 14 is surface treated with a plasma 10 containing carbon as shown in FIG. 5B prior to the heat treatment noted above. As a result, it is possible to prevent the surface of the wiring 14 from being oxidized by the subsequent heat treatment. It follows that, according to the present embodiment, it is possible to prevent the occurrence of cracks and peeling and to simplify the manufacturing process.

An example of the surface treatment noted above will now be described in detail.

The plasma 10 was generated by RIE using a gas containing CO, which was supplied into the chamber as a raw material gas, and the exposed portion of the wiring 14 was subjected to the surface treatment with the plasma 10. The flow rate of the raw material gas supplied into the chamber was set at 350 sccm, and the CO partial pressure within the chamber was set at 50 mTorr. Also, the plasma power was set at 400 W and the plasma processing, i.e., the surface treatment using the plasma 10, was performed for 10 seconds.

After the plasma processing, the composition of the surface of the wiring 14 was analyzed by an X-ray photoelectron spectroscopy (hereinafter referred to as "XPS"), the result of which is summarized in the table below:

| | Composition of surface region of copper wiring (atomic %) | | | | |
|---|---|---|---|---|---|
| | Carbon | | | | |
| | $CuCO_3$ | C—H /C—C | Total | Oxygen | Copper |
| Unprocessed | 10 | 16 | 26 | 32 | 42 |
| Plasma processed | 5 | 33 | 38 | 33 | 29 |
| Laser beam irradiated | 5 | 35 | 40 | 34 | 26 |

In the table, the column of "$CuCO_3$" denotes the concentration of the carbon atoms forming $CuCO_3$ based on all the atoms in the surface region of the wiring 14. Also, the column of "C—H/C—C" denotes the concentration of the sum of the carbon atoms forming the C—H bond and the carbons atoms forming the C—C bond based on all the atoms in the surface region of the wiring 14. Further, the column of "Total" denotes the concentration of the carbon atoms based on all the atoms in the surface region of the wiring 14.

As apparent from the data in the table, the carbon atom concentration in the surface region in the case where the plasma processing was applied is markedly higher than that in the case where the plasma processing was not applied. The experimental data suggests that carbon atoms or substance containing carbon atom is introduced into the surface region of the wiring 14 by the plasma processing. Incidentally, carbon atoms are contained in the surface region of the wiring 14 even in the case of "Unprocessed", i.e., the case where the plasma processing was not applied. This is because the surface region of the wiring 14 is contaminated with a substance containing carbon, which is present in the air atmosphere. The data in the table also indicates clearly that, where the plasma processing is applied, the concentration "$CuCO_3$" is markedly lowered and the concentration "C—H/C—C" is markedly increased, compared with the case where the plasma processing is not applied. It is noted that, in each of the cases, a copper carbide is not detected in the surface region of the wiring 14.

Then, the wiring 14 after the plasma processing was subjected to a heat treatment at 200° C. in the air atmosphere so as to examine the relationship between the duration of the heat treatment and the thickness of the oxide film formed on the surface of the wiring 14. Similarly, the wiring 14 before the plasma processing was subjected to the heat treatment at 200° C. in the air atmosphere so as to examine the relationship between the duration of the heat treatment and the thickness of the oxide film formed on the surface of the wiring 14.

Figure 6:
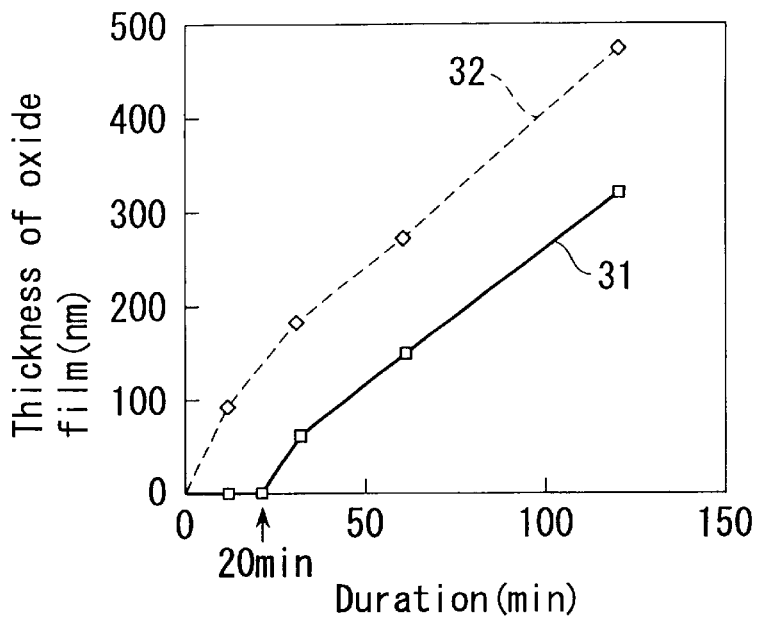
FIG. 6 is a graph showing a thickness of an oxide film formed in the case of applying an oxidizing treatment to the structure shown in FIGS. 5A and 5B.

FIG. 6 is a graph showing the thickness of the oxide film formed in the case where an oxidizing treatment was applied to the structure shown in FIGS. 5A and 5B. In the graph of FIG. 6, the duration of the heat treatment is plotted on the abscissa, with the thickness of the oxide film being plotted on the ordinate. Also, curve 31 shown in the graph denote the experimental data obtained in the case of applying the plasma processing, with curve 32 denoting the experimental data obtained in the case of not applying the plasma processing.

As apparent from FIG. 6, in the case where the plasma processing was not applied, formation of the oxide film was started simultaneously with the starting of the heat treatment. On the other hand, where the plasma processing was applied, the oxide film was scarcely formed in 20 minutes after the start-up of the heat treatment. In other words, if the duration of the heat treatment is within 20 minutes, it is possible to prevent formation of the oxide film by the plasma processing.

It may be reasonable to explain the above data as follows.

At a heat treatment temperature of, for example, 200° C., Gibbs free energy of CO or $CO_2$ is lower than that of $Cu_2O$. To be more specific, oxygen is more stable in the case where oxygen combines with carbon than in the case where oxygen is combined with copper. Also, C—H bond and the C—C bond are markedly rich in reactivity with oxygen, compared with $CuCO_3$.

As described above, the plasma processing permits markedly increasing the concentration "C—H/C—C" in the surface region of the wiring 14. Therefore, where the plasma processing is performed, oxygen reacts predominantly with the C—H bonds and the C—C bonds in the surface region of the wiring 14 on the heat treatment in the atmosphere containing oxygen so as to suppress oxidation of copper.

CO and $CO_2$ formed by the reaction of the C—H bond and the C—C bond with oxygen are gaseous under the temperature noted above and, thus, are promptly released from the surface of the wiring 14 into the atmosphere. Therefore, according to the present embodiment, the carbon atom concentration in the surface region of the wiring 14 is lowered with progress of the heat treatment in the atmosphere is containing oxygen. It follows that, according to the present embodiment, it is possible to make the C—H bond and the C—C bond, which are introduced into the surface region of the wiring 14, consumed substantially completely during the heat treatment by setting appropriately the plasma processing conditions and the heat treating conditions. In other words, according to the present embodiment, it is possible to suppress the carbon atom concentration in the surface region of the wiring 14 after the heat treatment to a sufficiently low level, with the result that the via contact between the first wiring 14 and the second wiring (not shown) formed on the first wiring 14 is not obstructed.

The composition was analyzed by XPS while removing the surface region of the wiring 14, which had been subjected to the plasma processing, by an Ar sputtering, with the result that the C—H bond and the C—C bond were detected in only the region up to 10 Å from the surface of the wiring 14. In addition, copper was found to be present in the surface region together with the C—H bond and the C—C bond. It follows that, according to the present embodiment, the via contact between the first wiring 14 and the second wiring (not shown) formed on the first wiring 14 is not obstructed even if the C—H bond and the C—C bond remain in the surface region of the wiring 14 after the heat treatment.

In the first embodiment, the effect of suppressing the oxidation is obtained generally in the case where the concentration "C—H/C—C" is 30 atomic % or more. In the surface region of the wiring 14, a ratio of the concentration "C—H/C—C" to the concentration "Copper" is preferably 1 or more. In this case, the effect of 20 suppressing the oxidation becomes more prominent.

In the surface region of the wiring 14, the ratio of the concentration "C—H/C—C" to the concentration "Copper" is preferably 10 or less, more preferably 5 or less, and most preferably 2 or less. In this case, generally, since copper concentration in the surface region of the wiring after the heat treatment is sufficiently high, the via contact between the first wiring 14 and the second wiring formed thereon is not obstructed.

The surface region of the wiring 14 which contains C—H bond and/or C—C bond may further contain carbon atoms in another form. The surface region can further contain, for example, a compound which does not have C—H bond and/or C—C such as copper carbonate or copper carbide.

In the present embodiment, a ratio of the concentration "C—H/C—C" to the concentration "Total" is preferably 0.70 or more, more preferably 0.80 or more, and most preferably 0.85 or more. As described above, a copper compound, which does not have C—H bond and/or C—C bond as $CuCO_3$, is poor in reactivity with oxygen compared to C—H bond and/or C—C bond. Therefore, the effect of suppressing the oxidation becomes more prominent when the ratio of the concentration "C—H/C—C" to the concentration "Total" is set as above. Incidentally, after the plasma processing described above and the laser beam irradiation described below in the forth embodiment, a ratio of the concentration "C—H/C—C" to the concentration "$CuCO_3$" is generally two or more.

A second embodiment of the present invention will now be described.

Figure 7A:
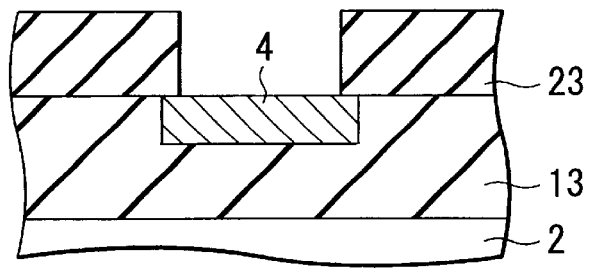
FIGS. 7A to 7C are cross sectional views schematically showing a manufacturing process of a semiconductor device according to a second embodiment of the present invention.
Figure 7B:
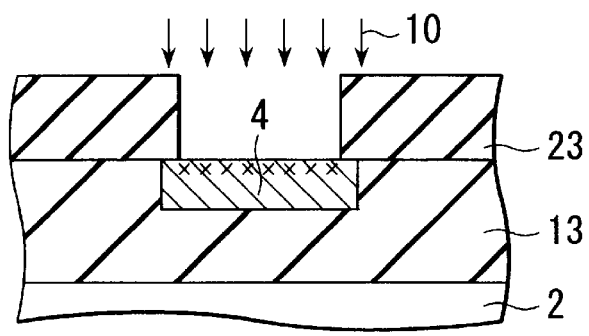
Figure 7C:
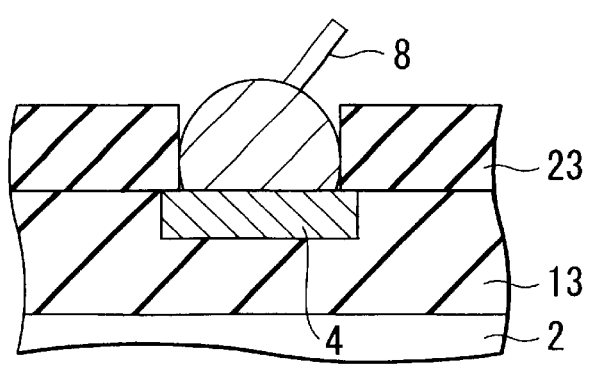

FIGS. 7A to 7C are cross sectional views schematically showing a manufacturing process of a semiconductor device according to the second embodiment of the present invention. The process according to the second embodiment is substantially equal to the process according to the first embodiment except that the plasma processing is applied to the bonding pad in the second embodiment.

In the structure shown in FIG. 7A, an interlayer insulation film 13 is formed on the semiconductor substrate 2. A bonding pad 4 made of copper is formed on the interlayer insulation film 13, and an insulation film 23 is formed on the interlayer insulation film 13 and the bonding pad 4. As shown in the drawing, an opening is formed in the insulation film 23 such that the bonding pad 4 is partially exposed to the outside within the opening.

In the second embodiment, as shown in FIG. 7B, the exposed portion of the pad 4 is treated with the plasma 10 as in the first embodiment. By this plasma processing, the C—H bond and the C—C bond are introduced into the surface region of the pad 4 as already described in conjunction with the first embodiment. As a result, oxidation of the pad 4 is suppressed when an Au wire 8 is bonded to the pad 4 in the air atmosphere as shown in FIG. 7C.

As described above, in the present embodiment, the pad 4 is prevented from being oxidized by the plasma processing, making it unnecessary to cover the exposed portion of the pad 4 with, for example, an aluminum electrode. Also, in the present embodiment, the surface region of the pad 4 contains copper as well as the C—H bond and the C—C bond, with the result that gold and copper are not prevented from being alloyed. It follows that, according to the present embodiment, it is possible to prevent the occurrence of cracks and peeling and to simplify the manufacturing process of the semiconductor device. Further, according to the present embodiment, since oxidation of the pad 4 is suppressed, formation of a connection between copper and gold can be carried out in the air atmosphere.

In the second embodiment, the plasma processing is applied to the wire bonding process. The plasma processing can also be applied to another bonding process such as a bonding process which utilizes an Au bump to be provided on the pad or a flip chip bonding process which utilizes a bump to be provided on the pad. In this case, similar effects can be obtained.

A third embodiment of the present invention will now be described.

FIGS. 8A to 8E are cross sectional views schematically showing a manufacturing process of a semiconductor device according to the third embodiment of the present invention. The process according to the third embodiment is substantially equal to the process according to the first embodiment except that the plasma processing is carried out before formation of the interlayer insulation film 23.

Figure 8A:
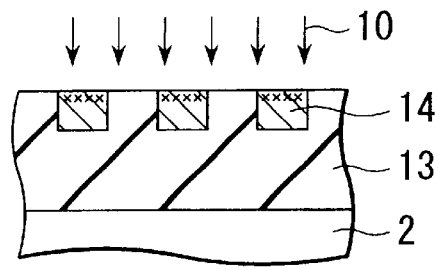
FIGS. 8A to 8E are cross sectional views schematically showing a manufacturing process of a semiconductor device according to a third embodiment of the present invention.

In the process according to the present embodiment, a first interlayer insulation film 13 is formed first on the surface of the semiconductor substrate 2 having a transistor, etc. formed on the surface. Then, a groove for the wiring is formed in the insulation film 13, followed by filling the groove with a layer which contains mainly copper by a sputtering method and the like. Further, that portion of the copper layer which is positioned outside the groove is removed by a chemical mechanical polishing (hereinafter referred to as "CMP") method so as to form a wiring 14, followed by processing the surface of the wiring 14 with the plasma 10 described previously in conjunction with the first embodiment. By this plasma processing, the C—H bond and the C—C bond are introduced into the surface region of the wiring 14 as described previously in conjunction with the first embodiment, thereby obtaining the structure as shown in FIG. 8A.

Figure 8B:
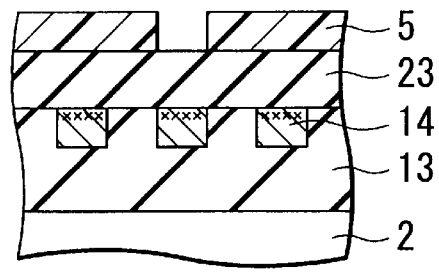
Figure 8C:
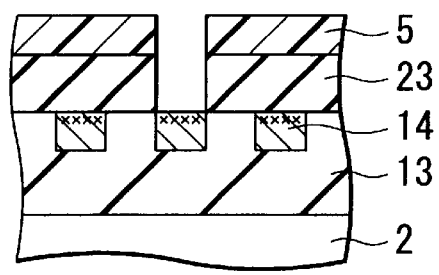

In the next step, a second interlayer insulation film 23 is formed on the insulation film 13 and the wiring layer 14, followed by forming a resist pattern 5 on the insulation film 23 by a photolithography technique and the like, as shown in FIG. 8B. Then, the insulation film 23 is patterned by RIE with use of the resist pattern 5 as an etching mask so as to obtain the structure as shown in FIG. 8C.

Figure 8D:
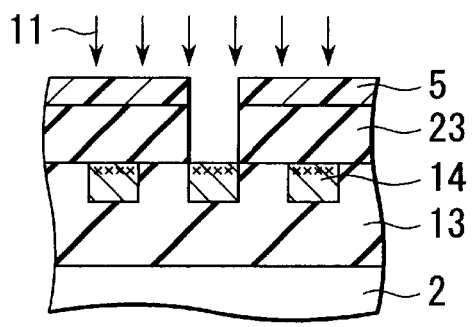

Further, the resist pattern 5 is removed by the ashing treatment performed in an atmosphere containing oxygen 11, as shown in FIG. 8D. In this ashing step, the C—H bond and the C—C bond introduced into the surface region of the wiring 14 serve to prevent copper from being oxidized as described previously in conjunction with the first embodiment.

Figure 8E:
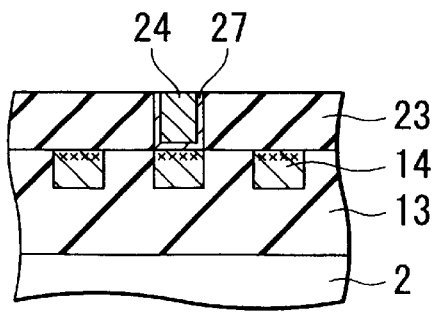

After the ashing treatment, a barrier metal layer 27 is formed on the bottom surface and the side walls of the groove formed in the insulation film 23, followed by filling the groove with a copper layer, as shown in FIG. 8E. Further, that portion of the copper layer which is positioned outside the groove is removed by the CMP method so as to form a copper layer 24. Incidentally, the barrier metal layer 27 serves to prevent copper from being diffused from the wiring 24 into, for example, the insulation film 23.

According to the third embodiment, it is possible to obtain the effect similar to that described previously in conjunction with the first embodiment. Also, in the third embodiment, the plasma processing is performed before formation of the insulation film 23. Therefore, in the structure shown in FIG. 8C, the C—H bond and the C—C bond are introduced not only into that portion of the wiring 14 which is exposed to the outside within the opening formed in the insulation film 23 but also into that portion of the wiring 14 which is covered with the insulation film 23. It should be not that, in the ashing step, the C—H bond and the C—C bond introduced into the former portion is consumed at least partially. However, the C—H bond and the C—C bond introduced into the latter portion is not consumed. Therefore, in the structure shown in FIG. 8E, the carbon atom concentration in the surface regions of the two wirings 14 positioned on the both sides is markedly higher than that in the surface region of the wiring 14 positioned in the center.

In each of the first to third embodiments described above, RIE using CO gas is utilized in the plasma processing. If the RIE is performed for a longer time, a thick amorphous carbon layer is formed on the wiring 14 and the pad 4. For example, in the case of performing the RIE for 60 seconds, formed was an amorphous carbon layer which contains 79.4 atomic % of carbon, 16.9 atomic % of oxygen and 3.7 atomic % of copper (the concentrations were obtained by XPS measurement).

In the case where the amorphous carbon layer is formed, copper is not oxidized at all even if the wiring 14 and the pad 4 are exposed to an oxidizing atmosphere at a high temperature of 400° C. or higher. In this case, however, the amorphous carbon layer is left unremoved even after the heat treatment under the oxidizing atmosphere. As a result, when the Au wire 8 is bonded to the pad 4, alloying of gold and copper is obstructed so as to make the connection of the Au wire 8 to the pad 4 impossible in some cases. Also, in the multilayer interconnection structure, the via contact resistance is increased because the amorphous carbon layer is interposed between the wiring 14 and the wiring 24.

It is possible to avoid the occurrence of the defective connection and the increase of the contact resistance by applying an RIE using $O_2$ gas after the RIE using CO gas so as to remove the excess portion of the amorphous carbon layer. For example, where an RIE using CO gas is performed for 60 seconds, followed by performing another RIE using $O_2$ gas for 30 seconds, it is possible to prevent the oxidation of copper, the occurrence of the defective connection and the increase of the contact resistance.

Also, where the heat treatment under the oxidizing atmosphere is carried out for the purpose other than the electrical connection to the wiring 14 and the pad 4, it is possible to employ the following method. Specifically, a sufficiently thick amorphous carbon layer is formed first on the wiring 14 and the pad 4, followed by applying a heat treatment under an oxidizing atmosphere. Then, the amorphous carbon layer remaining on the wiring 14 and the pad 4 is removed by an RIE using $O_2$ gas. This method is effective in the case where the heat treatment under the oxidizing atmosphere is carried out at a high temperature of 400° C. or higher.

In each of the first to third embodiments, it is possible to use a gas containing a compound having a carbon atom such as CO, $CO_2$, $C_2H_4$, $CH_3OH$ or $C_2H_5OH$ as the raw material gas of the plasma. Incidentally, if an RIE using a fluorine-containing compound such as $CF_4$, $C_4F_8$ or $SF_6$ as the raw material gas is applied to the wiring 14, $CuF_2$ is formed on the surface of the wiring 14. Even where $CuF_2$ is formed on the surface of the wiring 14, it is possible to suppress the oxidation of copper and to permit the Au wire to be bonded to the pad. In addition, it is possible to suppress the via contact resistance to a sufficiently low level.

For generating a plasma by using the raw material gas described above, it is possible to employ, for example, a plasma CVD method, an ECR method, an optical CVD method and a thermal CVD method in addition to the RIE method.

The plasma processing described above and the RIE treatment for forming the opening in the interlayer insulation film 23 can be carried out successively in the absence of oxygen. It should be noted that, where an RIE is utilized for the plasma processing, it is possible to carry out the plasma processing and the RIE treatment successively by carrying out these treatments within the same chamber and by changing the composition of the gas supplied into the chamber.

A fourth embodiment of the present invention will now be described.

Figure 9:
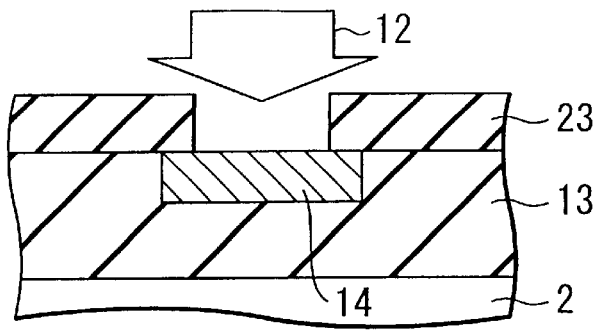
FIG. 9 is a cross sectional view schematically showing a manufacturing process of a semiconductor device according to a fourth embodiment of the present invention.

FIG. 9 is a cross sectional view schematically showing a manufacturing process of a semiconductor device according to the fourth embodiment of the present invention. In the structure shown in FIG. 9, an interlayer insulation film 13 is formed on the semiconductor substrate 2. Also, the wiring 14 made of copper is buried in the interlayer insulation film 13, and an interlayer insulation film 23 is formed on the interlayer insulation film 13 and the wiring 14. Further, an opening is formed in the interlayer insulation film 23 so as to expose a portion of the wiring 14 to the outside within the opening of the interlayer insulation film 23.

The fourth embodiment is substantially equal to the first embodiment except that a laser beam irradiation is employed in the fourth embodiment in place of the plasma processing. To be more specific, in the process according to the fourth embodiment, the exposed portion of the wiring 14 is irradiated with a laser beam 12 in the air atmosphere, as shown in FIG. 9. By the laser beam irradiation, the C—H bond and the C—C bond can be introduced into the surface region of the wiring 14.

An example of the laser beam irradiation will now be described.

Specifically, the exposed portion of the wiring 14 was irradiated with a laser beam by using a Q-switched YAG fourth harmonic laser with a wavelength of 266 nm. The pulse width was 5 to 10 nsec and the irradiation energy per pulse was 1 to 2 J/cm$^2$. Then, the composition of the surface region of the pad 4 was analyzed by XPS.

Figure 11A:
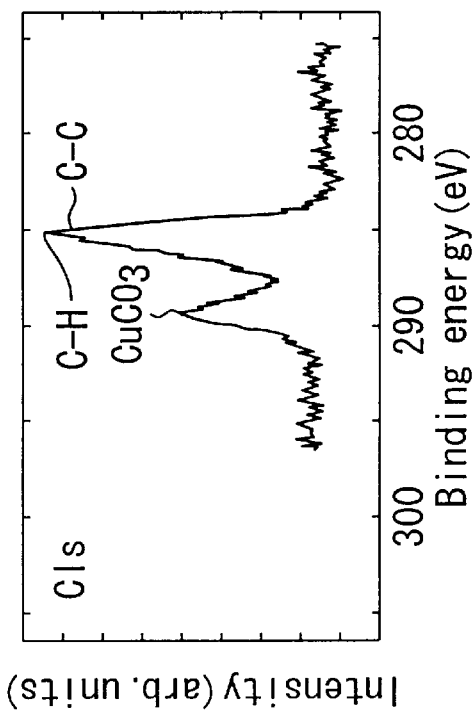
FIGS. 11A and 11B are graphs showing C1s and Cu2p3 spectrums obtained by X-ray photoelectron spectroscopy measurement applied to a pad not irradiated with a laser beam.
Figure 11B:
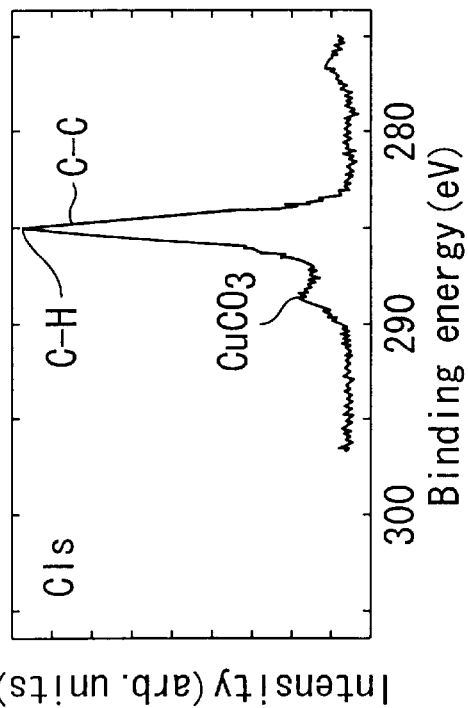
Figure 10A:
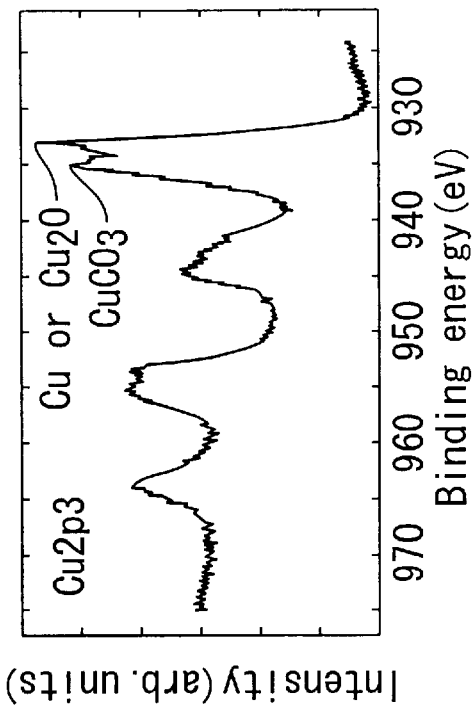
FIGS. 10A and 10B are graphs showing C1s and Cu2p3 spectrums obtained by X-ray photoelectron spectroscopy measurement applied to a surface of a pad irradiated with a laser beam shown in FIG. 9.
Figure 10B:
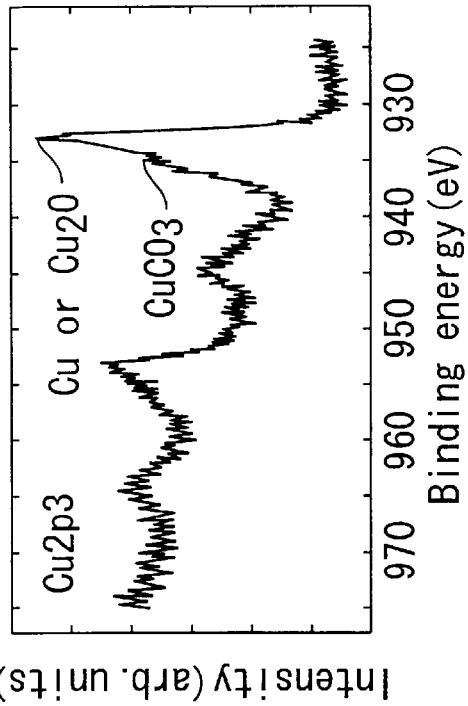

FIGS. 10A and 10B are graphs showing the C1s and Cu2p3 spectrums obtained by the XPS measurement applied to the surface of the pad 4 which was irradiated with the laser beam as shown in FIG. 9. On the other hand, FIGS. 11A and 11B are graphs showing the C1s and Cu2p3 spectrums obtained by the XPS measurement applied to the surface of the pad 4 which was not irradiated with the laser beam. In each of the graphs shown in FIGS. 10A, 10B, 11A and 11B, the binding energy is plotted on the abscissa, with the intensity being plotted on the ordinate.

The carbon atom concentrations obtained from the graphs of FIGS. 10A, 10B, 11A and 11B are summarized in the table given previously.

As apparent from the table, the carbon atom concentration in the surface region is markedly higher in the case where the laser beam irradiation was applied, compared with the case where the laser beam irradiation was not applied ("Unprocessed"). The experimental data indicates that a carbon atom or a substance containing carbon was introduced into the surface region of the wiring 14 by the laser beam irradiation. It is also indicated in the table that the concentration "CuCO$_3$" was markedly lowered and the concentration "C—H/C—C" was markedly increased in the case where the laser beam irradiation was performed, compared with the case where the laser beam irradiation was not performed ("Unprocessed"). In other words, the laser beam irradiation produces the effect of introducing the C—H bond and the C—C bond into the surface region of the wiring 14 as in the plasma processing employed in each of the first to third embodiments.

Then, the wiring 14 after the laser beam irradiation was subjected to a heat treatment at 200° C. in the air atmosphere so as to examine the relationship between the duration of the heat treatment and the thickness of the oxide film formed on the surface of the wiring 14. Also, the wiring 14 before the laser beam irradiation was subjected to the heat treatment at 200° C. in the air atmosphere so as to examine the relationship between the duration of the heat treatment and the thickness of the oxide film formed on the surface of the wiring 14.

Figure 12:
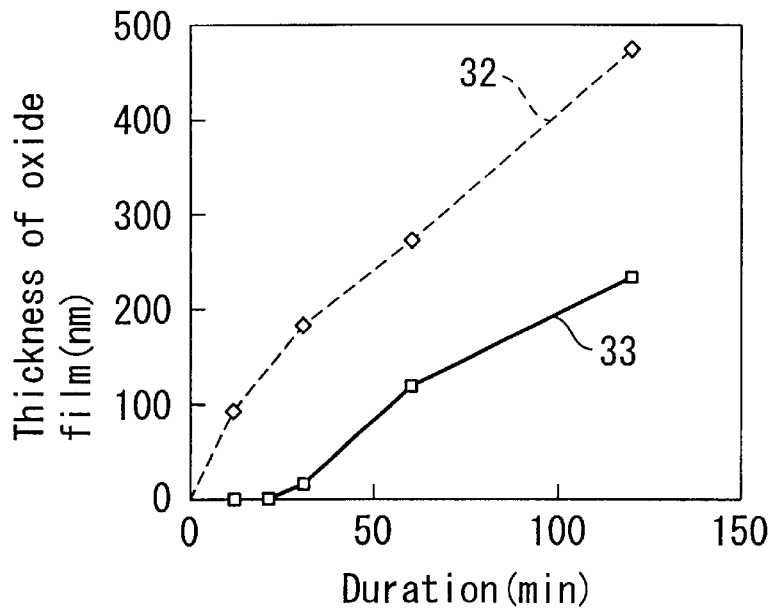
FIG. 12 is a graph showing a thickness of an oxide film formed in the case of applying an oxidizing treatment to the structure shown in FIG. 9.

FIG. 12 is a graph showing the thickness of the oxide film formed in the case where an oxidizing treatment was applied to the structure shown in FIG. 9. The duration of the heat treatment is plotted on the abscissa of the graph, with the thickness of the oxide film plotted on the ordinate. The curve 33 shown in the graph denotes the data obtained in the case of applying the laser beam irradiation, with the curve 32 denoting the data obtained in the case where the laser beam irradiation was not applied.

As apparent from FIG. 12, formation of the oxide film was started simultaneously with the starting of the heat treatment in the case where the laser beam irradiation was not applied. On the other hand, where the laser beam irradiation was applied, the oxide film was scarcely formed in about 20 minutes after the starting of the heat treatment. In other words, the effect similar to that obtained in the first embodiment was obtained in the fourth embodiment. Also, as apparent from the comparison between curve 31 shown in FIG. 6 and curve 33 shown in FIG. 12, the laser beam irradiation produces an effect of preventing oxidation greater than that obtained by the plasma processing.

The wiring 14 having the laser beam irradiation applied thereto was observed with a transmission electron microscope (hereinafter referred to as "TEM").

Figure 13A:
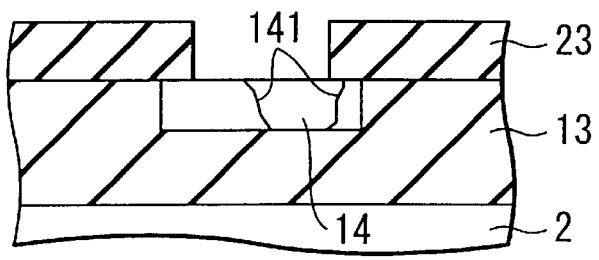
FIGS. 13A and 13B are cross sectional views schematically showing a wiring before and after the laser beam irradiation shown in FIG. 9.
Figure 13B:
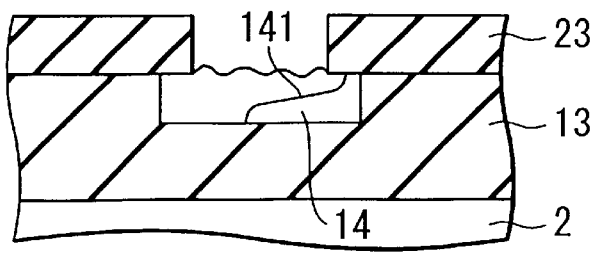

FIG. 13A is a cross sectional view schematically showing the wiring 14 before the laser beam irradiation shown in FIG. 9. FIG. 13B is a cross sectional view schematically showing the wiring 14 after the laser beam irradiation shown in FIG. 9. Reference numeral 141 in FIGS. 13A and 13B denotes a grain boundary.

Before the laser beam irradiation described above, the grain boundary 141 in the wiring 14 extends to the exposed surface of the wiring 14 as shown in FIG. 13A. If the laser beam irradiation is performed, the surface of the wiring 14 is generally subjected to the melting/recrystallization. As shown in FIG. 13B, the melting/recrystallization brings about an irregular structure on the surface of the wiring 14 and causes the growth of the crystal grains within the region down to thousands of angstroms from the surface of the go wiring 14, with the result that the grain boundary 141 which extends to the exposed surface of the wiring 14 vanishes. It follows that it is possible to judge whether the laser beam irradiation was applied to the wiring 14 by examining the surface structure and/or the crystal boundary in the wiring 14 by using, for example, a TEM.

In the fourth embodiment described above, C—H bond and C—C bond were introduced into the surface region of the wiring 14 by applying a laser beam irradiation under the air atmosphere. A similar effect can also be obtained by applying a laser beam irradiation under an atmosphere containing carbon or a carbon compound.

In the fourth embodiment, used was a Q-switched YAG fourth harmonic laser with a wavelength of 266 nm. However, it is also possible to use another laser. In the case of using a laser with a wavelength falling within an ultraviolet region, it is possible to effectively subject carbon or a carbon compound in the gaseous phase or on the wiring 14 to photolysis so as to effectively introduce the C—H bond and the C—C bond into the surface region of the wiring 14. The laser producing the particular effect includes, for example, a Q-switched YAG fourth harmonic laser with a wavelength of 266 nm noted above and a KrF excimer laser with a wavelength of 248 nm. In the case of irradiating the wiring 14 with a one pulse of laser beam by using the KrF excimer laser with a wavelength of 248 nm, it is possible to set the pulse width at 10 to 30 nsec and to set the irradiating energy at 1 to 2 J/cm². Incidentally, the lasers that can be used and the irradiating conditions are not limited to those described above and can be changed in various fashions.

Further, in the fourth embodiment, the laser beam irradiation under the air atmosphere was utilized for introducing the C—H bond and the C—C bond into the surface region of the wiring 14. Alternatively, the laser beam irradiation under the air atmosphere can also be utilized for introducing the C—H bond and the C—C bond into the surface region of the pad 4. In this case, it is possible to obtain the effect similar to that described previously in conjunction with the second embodiment. Also, the laser beam irradiation can be performed any time before the heat treatment in an oxidizing atmosphere. For example, the laser beam irradiation can be applied before formation of the insulation film 23.

A fifth embodiment of the present invention will now be described.

Figure 14A:
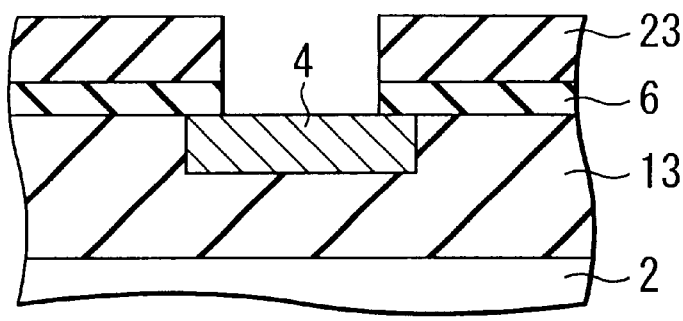
FIGS. 14A to 14C are cross sectional views showing a manufacturing process of a semiconductor device according to a fifth embodiment of the present invention.
Figure 14B:
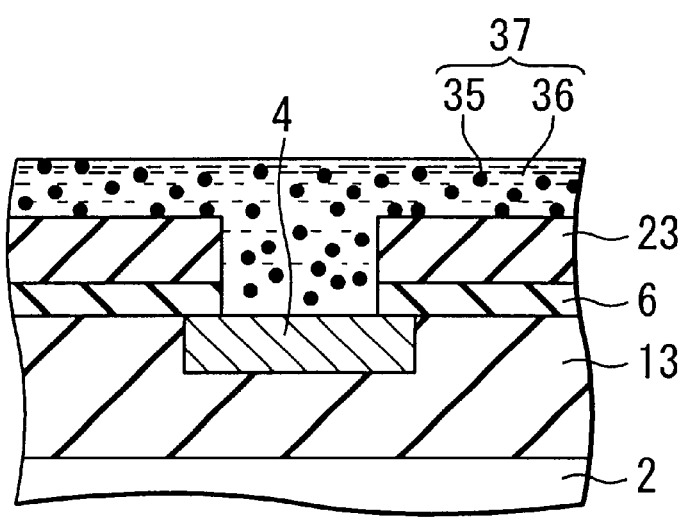
Figure 14C:
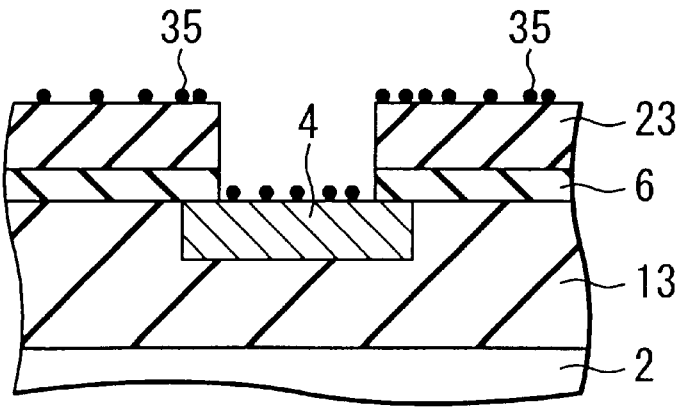

FIGS. 14A to 14C are cross sectional views schematically showing the manufacturing process of a semiconductor device according to the fifth embodiment of the present invention. In the structure shown in FIG. 14A, an interlayer insulation film 13 is formed on the semiconductor substrate 2. A bonding pad 4 made of copper is buried in the interlayer insulation film 13, and an SiN film 6 and an insulation film 23 are successively laminated on the interlayer insulation film 13 and the bonding pad 4. An opening is formed in the laminate structure of the SiN film 6 and the insulation film 23 to permit a part of the pad 4 to be exposed to the outside within the opening.

The fifth embodiment is substantially equal to the second embodiment except that the processing described below is applied in place of the plasma processing. Specifically, in the process according to the fifth embodiment, prepared first is the structure shown in FIG. 14A, followed by forming a coating film 37 by coating the pad 4 with a solution containing carbon-containing particles 35 and a solvent 36, as shown in FIG. 14B. Further, the coating film 37 is dried such that the particles 35 remain on the pad 4, as shown in FIG. 14C, followed by performing the bonding similar to that described previously in conjunction with the second embodiment.

Where the bonding is performed with the carbon-containing particles 35 attached to the pad 4, the oxidation of copper is suppressed in the vicinity of the particles 35, making it possible to obtain the effect similar to that described previously in conjunction with the second embodiment. The particular effect is demonstrated by, for example, the experiment described below.

Specifically, the coating film 37 was formed by coating the pad 4 made of copper with a solution prepared by dispersing carbon fine particles having a diameter of 1 $\mu$m to 5 $\mu$m in the solvent 36. Then, the solvent was evaporated from the coating film 37 so as to permit the carbon fine particles 35 to be attached to the pad 4. Incidentally, the average distance between adjacent carbon fine particles 35 was set at 10 $\mu$m or less. Further, a thermal oxidation treatment was performed at 200° C. to 350° C. in the air atmosphere, with the result that the oxidation rate of copper was markedly lowered.

In the fifth embodiment described above, the particles 35 were utilized for preventing the oxidation of the pad 4. Alternatively, the particles 35 can also be utilized for preventing the oxidation of the wiring 14. In this case, it is possible to obtain the effect similar to that described previously in conjunction with the third embodiment. Also, the steps described with reference to FIGS. 14B and 14C can be carried out any time before the heat treatment under the oxidizing atmosphere. For example, these steps can be carried out before formation of the insulation film 23.

In the present embodiment, it is possible for the particles 35 to be consumed completely at the finishing time of the thermal oxidation treatment or to remain on the pad 4 after the thermal oxidation treatment. Where the particles 35 remain on the pad 4 after the thermal oxidation treatment, it is possible to remove these particles 35 by, for example, an RIE using $O_2$ gas. This operation is advantageous in preventing an increase of the wiring capacitance, which is a problem in the semiconductor device for the processing with a high operating speed. Alternatively, where the particles 35 remain on the pad 4 after the thermal oxidation treatment, it is possible not to remove these particles 35. If there is a void among the particles 35, copper and gold can be alloyed. In other words, bonding of an Au wire to the pad 4 is possible.

In the fifth embodiment, it is possible for the particles 35 to be either conductive or insulating. In any case, an Au wire can be brought into direct contact with the pad 4 if there is a void among the particles 35. Therefore, a problem based on the surface resistance is not generated.

In the fifth embodiment, employed is a coating of a solution containing the particles 35 and the solvent 36 as described above, with the result that it is possible for the particles 35 to be attached to not only the pad 4 but also to the insulation film 23. In this case, a current leakage does not take place even if the particles 35 are conductive carbon fine particles, provided that there is a sufficiently large void among the particles 35.

In the fifth embodiment, the particle 35 attached to the pad 4 usually exhibits its function of preventing the oxidation of copper within an area of about 10 $\mu$m in radius. It follows that, if the distance between the adjacent particles 35 attached to the pad 4 is for example 10 $\mu$m or less, it is possible to prevent copper from being oxidized over the entire surface of the pad 4.

In the fifth embodiment, the wire bonding process is performed with the carbon-containing particles 35 attached to the pad 4. Alternatively, another bonding process such as a flip chip bonding process may be performed with the carbon-containing particles 35 attached to the pad 4. In this case, similar effects can be obtained.

In each of the first to fifth embodiments described above, carbon is supplied onto the surfaces of the wiring 14 and the pad 4 by means of the plasma processing, the laser beam irradiation or the coating. However, the method of supplying carbon is not limited to those referred to above. For example, it is also possible to employ the ion implantation method, the thermal diffusion method and the like.

A sixth embodiment of the present invention will now be described.

Figure 15A:
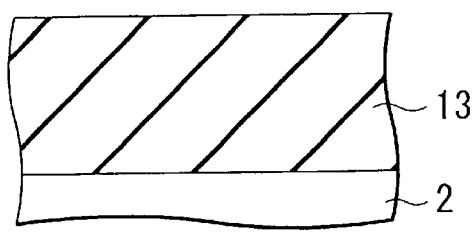
FIGS. 15A to 15G are cross sectional views schematically showing a manufacturing process of a semiconductor device according to a sixth embodiment of the present invention.

FIGS. 15A to 15G are cross sectional views schematically showing a manufacturing process of a semiconductor device according to the sixth embodiment of the present invention. In the process according to the sixth embodiment, a first interlayer insulation film 13 is formed first on the semiconductor substrate 2, as shown in FIG. 15A. In this embodiment, the interlayer insulation film 13 is an insulation film containing carbon such as an insulation film containing methyl polysiloxane.

Figure 15B:
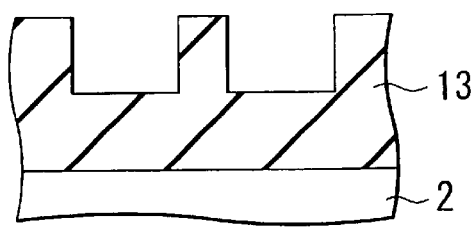

In the next step, an antireflection film (not shown) is formed on the insulation film 13, followed by forming a resist pattern (not shown) on the antireflection film by utilizing a photolithography technique. Further, the antireflection film and the insulation film 13 are patterned by an RIE using the resist pattern as an etching mask, followed by removing the antireflection film and the resist pattern by an RIE using $O_2$. As a result, a groove is formed in the insulation film 13, as shown in FIG. 15B.

Figure 15C:
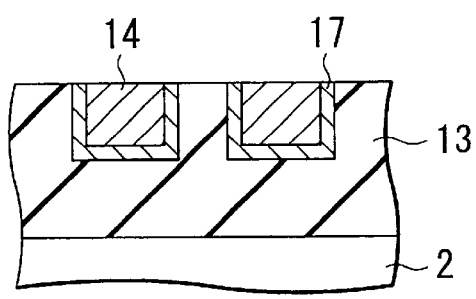

In the next step, a barrier metal layer 17 made of, for example, TaN is formed to cover the side walls and the bottom surface of the groove formed in the insulation film 13, followed by filling the groove with a copper layer by a plating method. Further, those portions of the barrier metal layer 17 and the copper layer which are positioned outside the groove are removed by a CMP method so as to form a first wiring 14 made of copper as shown in FIG. 15C.

Figure 15D:
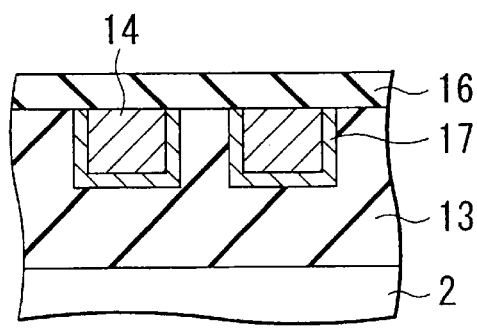

In the subsequent step, performed is a plasma processing similar to that described previously in conjunction with the first to third embodiments. To reiterate, surfaces of those portions of the insulation film 13, in which the barrier metal layer 17 and the wiring 14 are formed, are processed with a plasma for 30 seconds by using, for example, a carbon-containing gas, e.g., a $CH_4$ gas, as the raw material gas. Then, a diffusion barrier film 16 made of, for example, SiN is deposited on the insulation film 13 as shown in FIG. 15D by a plasma CVD using an $SiH_4$ gas and an $NH_3$ gas as the raw material gases.

Figure 15E:
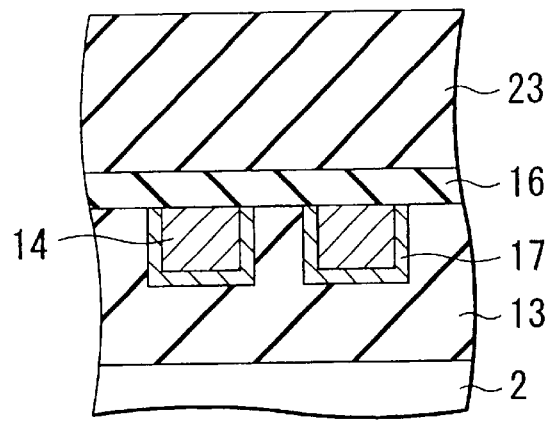

In the next step, a second interlayer insulation film 23 is formed on the diffusion barrier film 16, as shown in FIG. 15E. The second interlayer insulation film 23 is an insulation film containing carbon such as an insulation film containing methyl polysiloxane like the first interlayer insulation film 13.

Figure 15F:
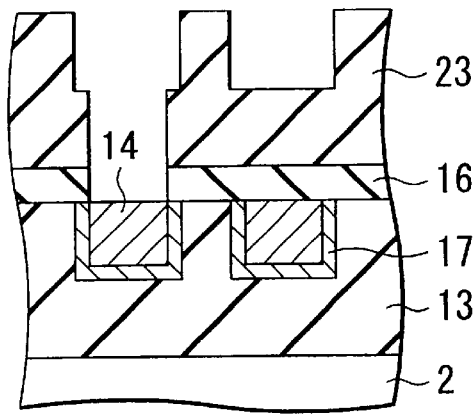

In the next step, a groove for the wiring is formed in the insulation film 23 and via holes are formed in the insulation film 23 and the diffusion barrier film 16 as shown in FIG. 15F by the method similar to that described above with reference to FIG. 15B. Incidentally, it is possible for the exposed surface of the wiring 14 to be oxidized in the etching step for forming the via holes. In this case, the oxide film formed on the surface of the wiring 14 is removed, as required, by, for example, a wet etching.

Figure 15G:
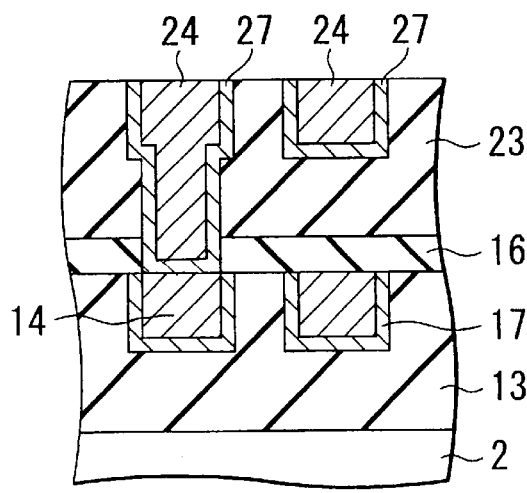

Further, a barrier metal layer 27 made of, for example, TaN and a second wiring 24 made of copper are formed as shown in FIG. 15G by the method similar to the method described previously with reference to FIG. 15C, thereby forming a multilayer interconnection structure which includes a pair of wiring layers as shown in FIG. 15C. Incidentally, a multilayer interconnection structure including three or more wiring layers can be formed by further repeating the plasma processing step and the steps shown in FIGS. 15D to 15G.

In the process according to the sixth embodiment, surfaces of those portions of the insulation film 13, in which the barrier metal layer 17 and the wiring 14 are formed, are processed with a plasma prior to the formation of the diffusion barrier film 16. By this plasma processing, carbon is introduced into the surface region of the insulating film 13. It follows that, according to the sixth embodiment, the migration of the organic component from within the insulation film 13 can be suppressed, and the surface region of the insulation film 13 is prevented from forming a brittle denatured layer.

Also, in the sixth embodiment, the surface region of the wiring 14 is reduced and carbon is introduced into the surface region of the wiring 14 by the plasma processing described above as in the first embodiment described previously. It follows that, in the sixth embodiment, the wiring 14 is prevented from being oxidized even if the wiring 14 is exposed to an oxidizing atmosphere between the plasma processing step and the step of forming the diffusion barrier film 16. In addition, the surface region of the wiring 14 subjected to the plasma processing described above exhibits a high corrosion resistance in respect of the wet etching.

As described above, the process according to the sixth embodiment makes it possible to lower both the wiring resistance and the wiring capacitance, to prevent the peeling occurrence, and to simplify the manufacturing process.

In the sixth embodiment described above, each of the interlayer insulation films 13 and 23 is an insulation film containing carbon such as a film containing an organosilicon oxide or a film containing an organic material. The organosilicon oxide noted above includes, for example, methyl polysiloxane. In many cases, the relative dielectric constant κ of the organosilicon oxide such as methyl polysiloxane is less than 3.0. It follows that the use of the particular material permits further decreasing the wiring capacitance.

Each of the insulation films 13 ands 23 can be formed by, for example, a coating method described below. Specifically, in the case of forming the insulation film 13 containing, for example, methyl polysiloxane, a varnish-like solution is prepared first by dissolving methyl polysiloxane in a solvent. Then, the substrate 2 is coated with the resultant solution by a coating method such as a spin coating method, followed by applying a heat treatment to the coating film. As a result, the solvent is evaporated from the coating film, and the methyl polysiloxane is fixed to the substrate 2, thereby forming the insulation film 13.

In the film forming method described above, it is possible to perform successively a heat treatment at 80° C. for about one minute, a heat treatment at 200° C. for about one minute, and a heat treatment at 420° C. for about 30 minutes. Where a heat treatment is performed stepwise in this fashion, it is possible to evaporate the solvent uniformly from the coating film, with the result that it is possible to improve the evenness of the insulation film 13.

Also, in the film forming method in this embodiment, it is possible to carry out the heat treatment under an inert gas atmosphere such as a nitrogen gas atmosphere. In this case, it is possible to suppress the undesired reaction between methyl polysiloxane and the substance contained in the atmosphere.

Figure 16A:
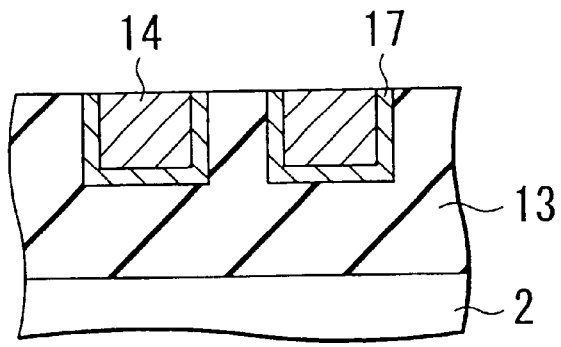
FIGS. 16A to 16C are cross sectional views schematically showing a manufacturing process of a semiconductor device according to a seventh embodiment of the present invention.
Figure 16B:
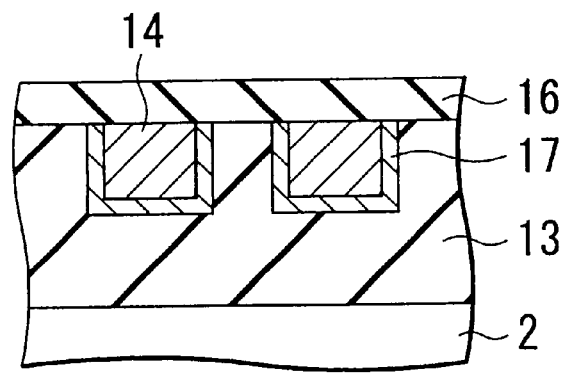
Figure 16C:
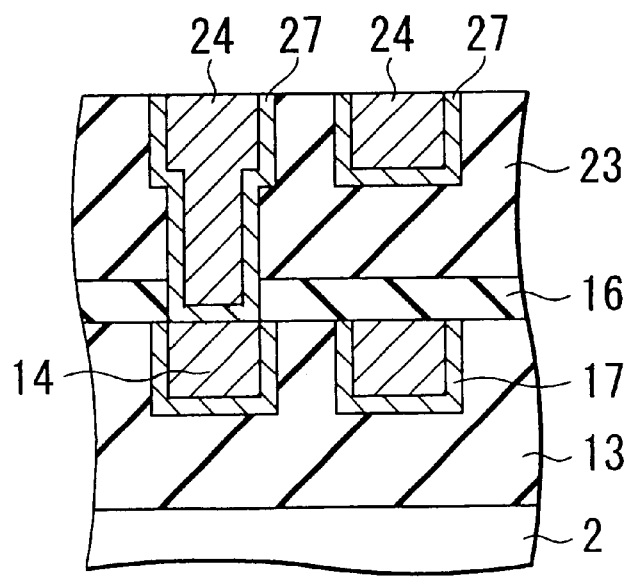

FIGS. 16A to 16C are cross sectional views schematically showing a manufacturing process of a semiconductor device according to a seventh embodiment of the present invention. In the process according to the seventh embodiment, the steps described previously with reference to FIGS. 15A to 15C relating to the sixth embodiment are carried out first so as to obtain the structure shown in FIG. 16A.

In the next step, a plasma processing similar to that described previously in conjunction with the first to third embodiments is carried out. Specifically, surfaces of those portions of the insulation film 13, in which the barrier metal layer 17 and the wiring 14 are formed, are processed, for example, for 30 seconds with a plasma using a carbon-containing gas such as a $CH_4$ gas as the raw material gas. Incidentally, according to an example, the carbon atom concentration in the surface region of the wiring 14 after the plasma processing is about 38 atomic %, and almost all the carbon atoms in the surface region form C—C bonds and C—H bonds.

In the next step, a diffusion barrier film 16 containing an organic material is formed by a coating method on the insulation film 13, as shown in FIG. 16B. For forming the diffusion barrier film 16, a varnish-like solution is prepared first by dissolving, for example, polyarylene in a solvent, followed by coating the insulation film 13 with the resultant solution by a coating method such as a spin coating method. Further, a heat treatment is applied to the coating film so as to evaporate the solvent from the coating film, with the result that polyarylene is fixed to the insulation film 13, thereby obtaining the diffusion barrier film 16.

In the film forming method described above, it is possible to perform successively a heat treatment at 80° C. for about one minute, a heat treatment at 200° C. for about one minute, and a heat treatment at 400° C. for about 30 minutes. In the film forming method described above, it is possible to carry out the heat treatment in an inert gas atmosphere such as a nitrogen gas atmosphere. In this case, it is possible to suppress the undesired reaction between polyarylene and the substance contained in the atmosphere.

After the formation of the diffusion barrier film 16 on the insulation film 13, performed are the steps described previously with reference to FIGS. 15E to 15G in conjunction with the sixth embodiment so as to obtain a two layer wiring structure as shown in FIG. 16C. Incidentally, a laminate structure including three or more wiring layer can be formed by further repeating the plasma processing step and the steps described above with reference to FIGS. 16B and 16C.

In the seventh embodiment, performed is a plasma processing similar to that performed in the sixth embodiment. Therefore, according to the present embodiment, it is possible to decrease both the wiring resistance and the wiring capacitance, to prevent the peeling occurrence, and to simplify the manufacturing process like the sixth embodiment. Incidentally, in the seventh embodiment, any of the diffusion barrier film 16 and the interlayer insulation films 13 and 23 is made of an organic material and, thus, the bonding strength among these diffusion barrier film and interlayer insulation films is rendered higher. Also, in the seventh embodiment, each of the interlayer insulation films 13 and 23 is an insulation film containing carbon as in the sixth embodiment, making it possible to further lower the wiring capacitance.

Further, according to the seventh embodiment, it is possible to prevent the wiring 17 from being oxidized in spite of the construction that the diffusion barrier film 16 is formed by a coating method, as described below. Specifically, polyarylene is subjected to a crosslinking reaction by the heat treatment applied in the step of forming the diffusion barrier film 16, with the result that $H_2O$ may be generated as a by-product of the reaction. It should be noted that copper tends to be oxidized when heated in the presence of water. In the seventh embodiment, however, the oxidation of the wiring 14 is suppressed because the plasma processing is applied to the wiring 14 before formation of the diffusion barrier film 16.

What should also be noted is that, in the seventh embodiment, a coating method is employed for forming the diffusion barrier film 16, making it possible to save the cost of equipment and the processing time, compared with the case of utilizing, for example, a CVD method. Incidentally, the coating method can be employed in the present embodiment for forming the diffusion barrier film 16 because the oxidation of the wiring 14 can be prevented by the plasma processing described above.

In each of the sixth and seventh embodiments, the interlayer insulation films 13 and 23 are formed by the coating method. However, it is also possible to employ, for example, a plasma CVD method for forming the interlayer insulation films 13 and 23. For example, it is possible to form each of the interlayer insulation films 13 and 23 by a plasma CVD method using a gas containing an organosilane such as trimethyl silane [$(CH_3)_3SiH$] or tetramethyl silane [$(CH_3)_4Si$] and an oxidizing gas such as $O_2$ or $N_2O$. The film obtained by this method generally has a low dielectric constant.

Also, in each of the sixth and seventh embodiments, an organosilicon oxide such as methyl polysiloxane is used as the material of each of the interlayer insulation films 13 and 23. However, the materials of the interlayer insulation films 13 and 23 are not particularly limited as far as the insulation film contains carbon like an insulation film containing an organic material. For example, it is possible to use a material containing carbon atoms in the skeleton such as polyarylene, polyarylene ether or polyamide as the material of the interlayer insulation films 13 and 23. The film formed by using such a material generally usually has a low dielectric constant.

Further, in each of the sixth and seventh embodiments, the plasma processing is performed by using a gas containing methane ($CH_4$) as the raw material gas. However, it is also possible to perform the plasma processing by using another gas such as a gas containing a compound having carbon atoms. In the case of using a gas containing a compound having carbon and hydrogen such as ethane ($C_2H_6$) or propane ($C_3H_8$) for the plasma processing, it is possible to obtain the effect similar to that obtained in the case of using a gas containing methane.

In the sixth embodiment, the diffusion barrier film 16 is formed by a plasma CVD method using an $SiH_4$ gas and an $NH_3$ gas as the raw material gases. However, it is also possible to use other gases as the raw material gases. For example, it is possible to form as the diffusion barrier film 16 an SiCH film or an SiCHO film by a plasma CVD method using a gas containing an organosilane such as trimethyl silane [$(CH_3)_3SiH$] or a tetramethyl silane [$(CH_3)_4Si$] and an oxidizing gas.

Further, in the seventh embodiment, an insulation film containing polyarylene is formed by a coating method as the diffusion barrier film 16. However, it is also possible to use another material in place of polyarylene. For example, it is possible to use a compound having carbon and hydrogen such as polyether.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   forming a first conductive layer containing copper on a semiconductor substrate;
   supplying a surface of the first conductive layer with a substance containing carbon; and
   forming a second conductive layer on the surface of the first conductive layer on which carbon originating from the substance remains, the first and second conductive layers being in contact with each other at the surface on which carbon remains.

2. The method according to claim 1, further comprising:
   exposing the first conductive layer to an atmosphere which contains oxygen after the supply of the substance containing carbon and before the formation of the second conductive layer.

3. The method according to claim 1, wherein the formation of the second conductive layer is performed in an atmosphere which contains oxygen.

4. The method according to claim 1, further comprising:

forming a first insulation layer above the semiconductor substrate before the formation of the first conductive layer, the formation of the first conductive layer above the semiconductor substrate being performed with the first insulation layer interposed therebetween;

forming a second insulation layer on the first conductive layer;

forming a resist pattern on the second insulation layer;

patterning the second insulation layer by etching with use of the resist pattern as an etching mask so as to partially expose the surface of the first conductive layer; and removing the resist pattern after the etching, the formation of the second conductive layer being performed after the removal of the resist pattern.

5. The method according to claim 4, wherein the supply of the substance containing carbon is performed before the formation of the second insulation layer.

6. The method according to claim 4, wherein the supply of the substance containing carbon is performed after the etching.

7. The method according to claim 6, wherein the supply of the substance containing carbon and the etching are sequentially performed within a single chamber.

8. The method according to claim 1, wherein the supply of the substance comprises surface treating the first conductive layer with a plasma containing carbon.

9. The method according to claim 1, wherein the supply of the substance comprises irradiating the surface of the first conductive layer with a laser beam in an atmosphere containing carbon.

10. The method according to claim 1, wherein the supply of the substance containing carbon comprises:

forming a layer containing carbon on the surface of the first conductive layer; and partially removing the layer containing carbon by etching.

11. The method according to claim 1, wherein the supply of the substance containing carbon comprises:

coating the surface of the first conductive layer with a solution containing a solvent and particles so as to form a coating film, each of the particles containing carbon and being dispersed in the solvent; and drying the coating film while making the particles stay on the surface of the first conductive layer.

12. A method of manufacturing a semiconductor device, comprising:

forming a conductive layer on a first insulation layer containing carbon, the first insulation layer being supported by a semiconductor substrate;

treating exposed surfaces of the conductive layer and the first insulation layer with a plasma containing carbon; and forming a second insulation layer on the conductive layer and the first insulation layer after the treatment of the surfaces with the plasma.

13. The method according to claim 12, wherein the plasma further contains hydrogen.

14. The method according to claim 12, wherein the first insulation layer contains an organosilicon oxide.

15. The method according to claim 12, wherein the second insulation layer contains an organic material.

16. The method according to claim 12, wherein the second insulation layer is formed by a coating.

17. The method according to claim 12, wherein the conductive layer is a first wiring and the method further comprises:

forming a third insulation layer on the second insulation layer;

forming a hole in the second insulation layer and the third insulation layer, a portion of the surface of the first wiring being exposed within the hole; and forming a second wiring on the third insulation layer, the second wiring being electrically connected to the first wiring via the hole.

* * * * *